(12) United States Patent
Wu

(10) Patent No.: US 10,707,262 B2
(45) Date of Patent: Jul. 7, 2020

(54) DETECTING DEVICE

(71) Applicant: InnoLux Corporation, Miao-Li County (TW)

(72) Inventor: Chih-Hao Wu, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 16/109,929

(22) Filed: Aug. 23, 2018

(65) Prior Publication Data

US 2019/0109172 A1   Apr. 11, 2019

(30) Foreign Application Priority Data

Oct. 10, 2017   (CN) .......................... 2017 1 0933862

(51) Int. Cl.
| | | |
|---|---|---|
| *H01L 27/146* | (2006.01) | |
| *H01L 31/08* | (2006.01) | |
| *H01L 31/115* | (2006.01) | |
| *G01T 1/20* | (2006.01) | |

(52) U.S. Cl.
CPC ....... *H01L 27/14663* (2013.01); *G01T 1/2018* (2013.01); *H01L 27/1462* (2013.01); *H01L 27/14603* (2013.01); *H01L 27/14636* (2013.01); *H01L 31/085* (2013.01); *H01L 31/115* (2013.01)

(58) Field of Classification Search
CPC ......... H01L 27/14636; H01L 27/14607; H01L 27/14603; H01L 27/1462; H01L 27/14658–14663; H01L 31/115; G01T 1/2018; G01T 1/2006
See application file for complete search history.

(56) References Cited

U.S. PATENT DOCUMENTS 6,559,451 B1 * 5/2003 Izumi ................... H01L 27/12
                                            250/370.01
7,206,037 B2 * 4/2007 Nishio .............. G02F 1/133308
                                            349/58

(Continued)

FOREIGN PATENT DOCUMENTS

| CN | 202549191 U | 11/2012 |
| CN | 105283779 A | 1/2016 |
| JP | H11-223891 A | 8/1999 |

OTHER PUBLICATIONS

Chinese language office action dated Dec. 4, 2019, issued in application CN. 201710933862.3.

*Primary Examiner* — Zandra V Smith
*Assistant Examiner* — Jeremy J Joy
(74) *Attorney, Agent, or Firm* — McClure, Qualey & Rodack, LLP

(57) ABSTRACT

A detecting device is provided. The detecting device includes a substrate, at least one transistor, at least one detecting element, and a scintillator layer. The transistor is disposed on the substrate. The detecting element is disposed on the transistor and electrically connects to the transistor. The detecting element includes a first electrode layer, a semiconductor layer, and a second electrode layer. The semiconductor layer is disposed on the first electrode layer, and the second electrode layer is disposed on the semiconductor layer. The scintillator layer is disposed on one side of the substrate, wherein at least one corner area of the scintillator layer has a curved structure or a chamfered structure.

18 Claims, 13 Drawing Sheets

(56) References Cited

U.S. PATENT DOCUMENTS

| | | | |
|---|---|---|---|
| 7,655,918 B2* | 2/2010 | Liu | H04N 5/335 250/370.11 |
| 8,716,932 B2 | 5/2014 | Rappoport et al. | |
| 9,810,791 B2* | 11/2017 | Homma | G01T 1/2018 |
| 2002/0014592 A1* | 2/2002 | Rutten | G01T 1/2018 250/368 |
| 2009/0108209 A1* | 4/2009 | Jung | G01T 1/2018 250/370.11 |
| 2012/0218219 A1* | 8/2012 | Rappoport | H01L 27/3276 345/174 |
| 2012/0235026 A1* | 9/2012 | Wu | H01L 27/14663 250/214 P |
| 2013/0019462 A1* | 1/2013 | Shoji | G01T 1/2018 29/595 |
| 2013/0112882 A1* | 5/2013 | Osawa | G01T 1/2006 250/361 R |
| 2013/0148312 A1* | 6/2013 | Han | H05K 7/00 361/736 |
| 2013/0187837 A1* | 7/2013 | Yokoyama | G09G 5/003 345/55 |
| 2013/0207169 A1* | 8/2013 | Wu | H01L 27/14643 257/292 |
| 2014/0027647 A1* | 1/2014 | Matsumoto | G01T 1/2006 250/366 |
| 2014/0091223 A1* | 4/2014 | Menge | G01T 1/1644 250/366 |
| 2014/0103347 A1* | 4/2014 | Ishino | H01L 27/14692 257/59 |
| 2014/0151684 A1* | 6/2014 | Wu | H01L 27/1225 257/43 |
| 2014/0217399 A1* | 8/2014 | Wu | H01L 27/14603 257/43 |
| 2014/0284487 A1* | 9/2014 | Sawada | G01T 1/202 250/368 |
| 2015/0036300 A1* | 2/2015 | Park | H05K 1/147 361/749 |
| 2016/0245931 A1* | 8/2016 | Kurebayashi | H01L 27/14636 |
| 2016/0365381 A1* | 12/2016 | Zhao | H01L 31/105 |
| 2017/0023682 A1* | 1/2017 | Liu | G01T 1/2018 |
| 2017/0082558 A1* | 3/2017 | Liu | A61B 6/4233 |
| 2017/0293038 A1* | 10/2017 | Menge | G01T 1/2018 |
| 2017/0294621 A1* | 10/2017 | Higano | H01L 51/5253 |
| 2017/0329023 A1* | 11/2017 | Homma | G01T 1/202 |
| 2018/0074216 A1* | 3/2018 | Yoshida | H01L 31/032 |
| 2018/0329084 A1* | 11/2018 | Karim | G01T 1/247 |

* cited by examiner

DETECTING DEVICE

CROSS REFERENCE TO RELATED APPLICATIONS

This Application claims priority of China Patent Application No. 201710933862.3, filed on Oct. 10, 2017, the entirety of which is incorporated by reference herein.

BACKGROUND

Technical Field

The disclosure relates to detecting devices, and in particular to a detecting device including a scintillator layer with a curved structure or a chamfered structure.

Description of the Related Art

X-ray detecting devices are widely applied because they are able to perform detection without causing physical damage to the item being inspected. In general, an X-ray detecting device includes an X-ray detecting panel and a detecting driving circuit that is electrically connected to the X-ray detecting panel. The X-ray detecting panel converts light signals into electronic signals, and transmits these electronic signals to the detecting driving circuit to obtain information about the corresponding image.

However, there is increasing demand for such detecting devices to be light, thin, and have a narrow frame. Given this trend, a collision will usually cause defects in the scintillator layer in the detecting device. Therefore, the detection effectiveness and display quality of the detecting device become poor.

BRIEF SUMMARY

Some embodiments of the disclosure provide a detecting device, including a substrate, at least one transistor, at least one detecting element, and a scintillator layer. The transistor is disposed on the substrate, and the detecting element is disposed on and electrically connected to the transistor. The detecting element includes a first electrode layer, a semiconductor layer, and a second electrode layer. The semiconductor layer is disposed on the first electrode layer, and the second electrode layer is disposed on the semiconductor layer. The scintillator layer is disposed on one side of the substrate, wherein at least one corner area of the scintillator layer includes a curved structure or a chamfered structure.

To clarify the features and advantages of the present disclosure, a detailed description is given in the following embodiments with reference to the accompanying drawings.

BRIEF DESCRIPTION OF THE DRAWINGS

The disclosure can be more fully understood by reading the subsequent detailed description and examples with references made to the accompanying drawings, wherein.

DETAILED DESCRIPTION

Figure 1A:
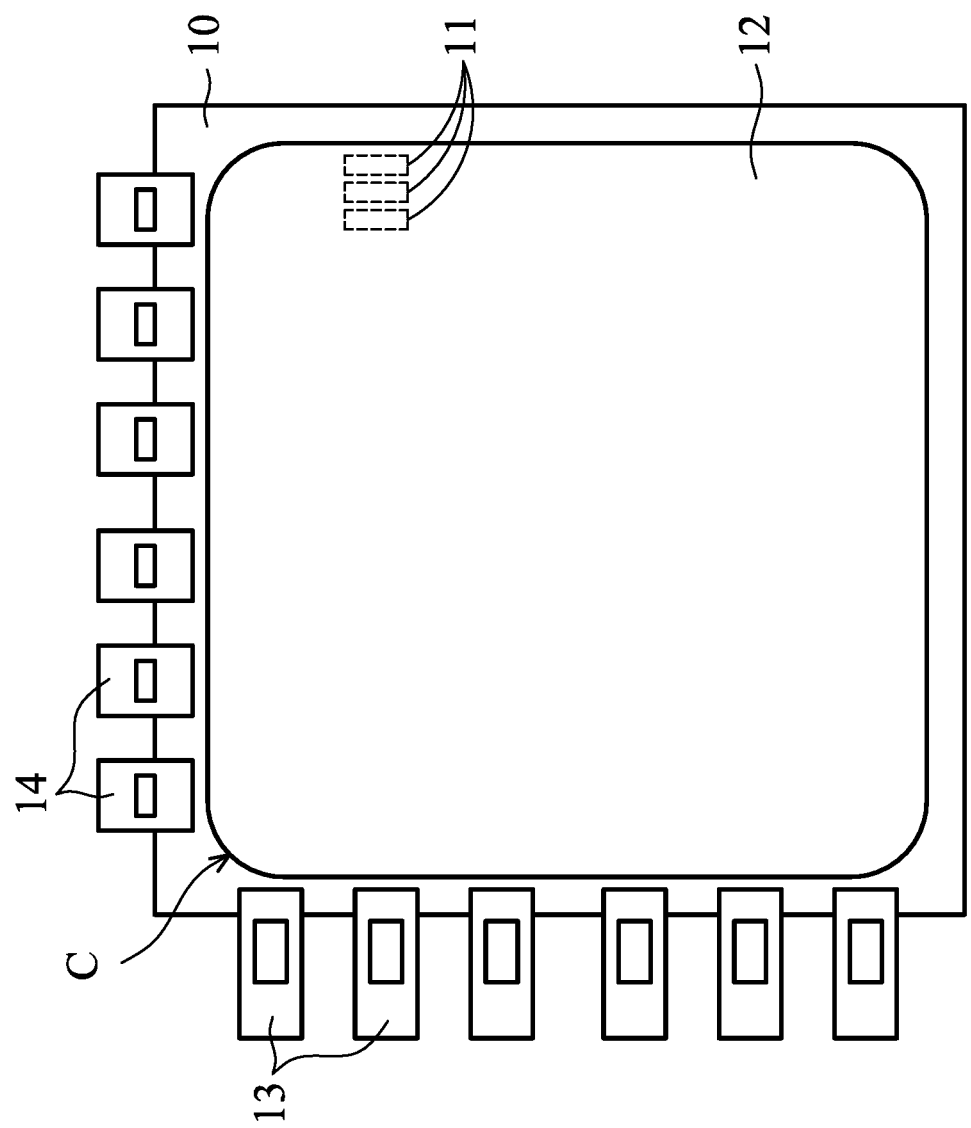
FIG. 1A is a top view of a detecting device in accordance with an embodiment of the present disclosure.

The detecting devices in some embodiments of the present disclosure are described in detail in the following description. It should be appreciated that the following detailed description provides various embodiments and examples in order to perform various patterns of the present disclosure. The specific elements and configurations described in the following detailed description are set forth in order to clearly describe the present disclosure. It will be apparent that the exemplary embodiments set forth herein are used merely for the purpose of illustration, and the inventive concept may be embodied in various forms without being limited to those exemplary embodiments. In addition, the drawings of different embodiments may use repeated numerals or marks. Those repetitions are used merely in order to clearly describe the present disclosure. However, the use of repeated numerals in the drawings of different embodiments does not suggest any correlation between different embodiments and/or configurations. In addition, in this specification, expressions such as "first material layer disposed on/over/above a second material layer", may indicate the direct contact of the first material layer and the second material layer, or it may indicate a non-contact state with one or more intermediate layers between the first material layer and the second material layer. In the above situation, the first material layer may not be in direct contact with the second material layer.

It should be understood that elements or devices in the figures may exist in various forms which are known to those skilled in the art. In addition, when a certain layer is "on" another layer or the substrate, it may indicate the certain layer is "directly" on the other layer or the substrate, or the certain layer is over the other layer or the substrate, or another layer is disposed between the other layer and the substrate.

In addition, in this specification, relative expressions may be used. For example, "lower", "bottom", "higher" or "top" are used to describe the position of one element relative to another. It should be appreciated that if a device is flipped upside down, an element that is "lower" will become an element that is "higher".

The terms "about", "substantially" and "approximately" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. When there is no specific description, the stated value includes the meaning of "about", "substantially", or "approximately".

It should be understood that, although the terms "first", "second", "third" etc. may be used herein to describe various elements, components, regions, layers and/or portions, and these elements, components, regions, layers, portions and/or sections should not be limited by these terms. These terms are merely used to distinguish one element, component, region, layer, and/or portion. Thus, a first element, component, region, layer and/or portion discussed below could be termed a second element, component, region, layer or portion without departing from the teachings of the present disclosure.

Unless defined otherwise, all the terms (including technical and scientific terms) used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined in the present disclosure.

This description of the exemplary embodiments is intended to be read in connection with the accompanying drawings, which are to be considered part of the entire written description. It should be appreciated that the drawings are not drawn to scale. The shape and the thickness of embodiments may be exaggerated in the drawings to clarify the features of the present disclosure. In addition, structures and devices are shown schematically in order to clarify the features of the present disclosure.

In some embodiments of the present disclosure, relative terms such as "downwards," "upwards," "horizontal," "vertical,", "below," "above," "top" and "bottom" as well as derivative thereof should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are in contact with one another either directly or indirectly, wherein there are other structures disposed between both the structures, unless expressly described otherwise. These relative terms also include the relationships wherein both structures are movable or rigid attachments.

It should be noted that, the term "substrate" is meant to include elements formed on a semiconductor wafer and the layers overlying the semiconductor wafer. All semiconductor element needed may be already formed on the semiconductor wafer. However, the semiconductor wafer is represented with a flat substrate in order to simplify the drawing. In addition, the term "substrate surface" is meant to include the uppermost exposed layers on a semiconductor wafer, such as a silicon surface, an insulating layer and/or metallic lines.

The embodiments of the present disclosure provides a scintillator layer that at least one corner area of the scintillator layer has a curved structure or a chamfered structure, and thereby the detecting effect and display quality of the detecting device can be enhanced.

Figure 1B:
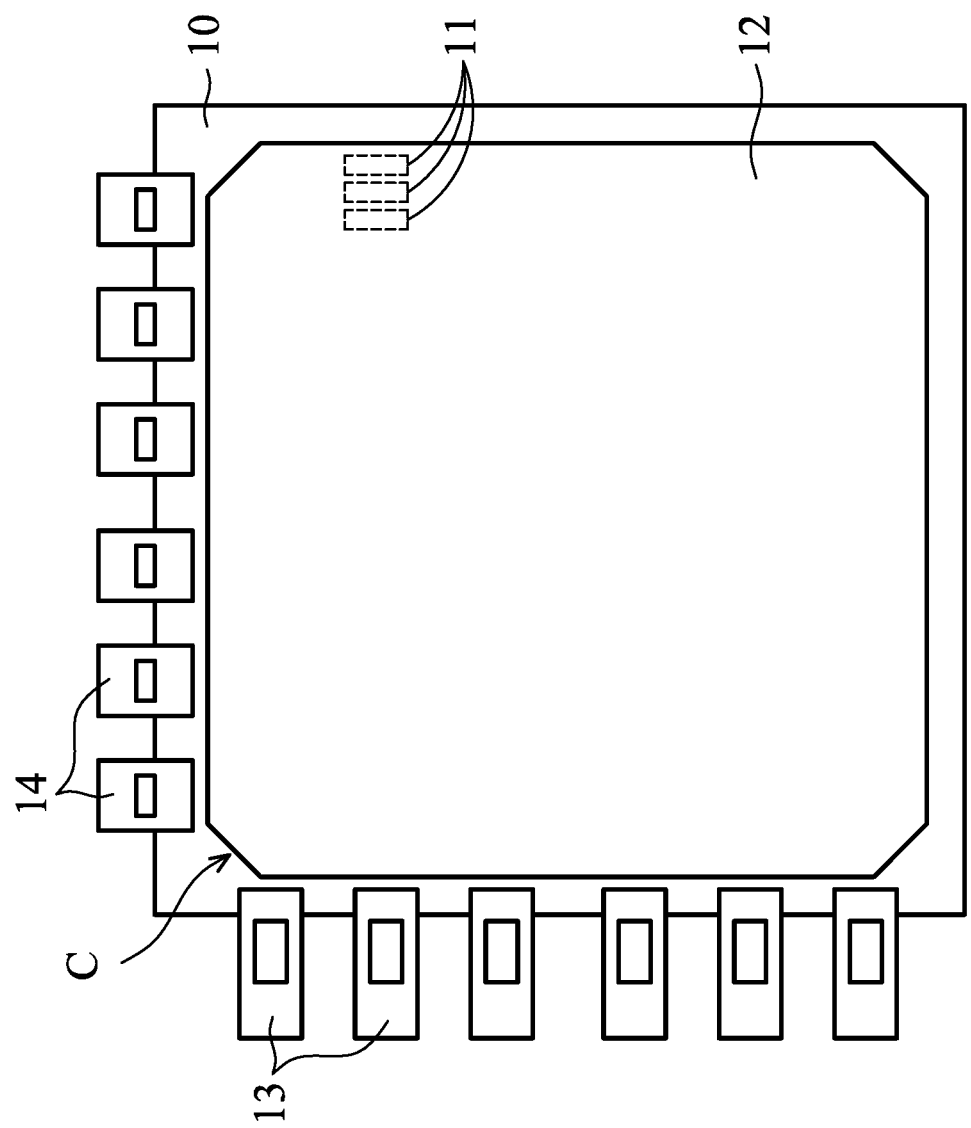
FIG. 1B is a top view of a detecting device in accordance with another embodiment of the present disclosure.

FIGS. 1A and 1B are top views of a detecting device 1 in accordance with two different embodiments of the present disclosure. As shown in FIGS. 1A and 1B, the detecting device 1 includes a substrate 10, and a plurality of detecting units 11 are arranged between the substrate 10 and a scintillator layer 12. For clarity of illustration, just three detecting units 11 are shown in FIGS. 1A-1B, and driving circuits (such as transistors, gate lines, data lines, or capacitors) of the detecting units 11 are partially omitted. The materials of the substrate 10 may include quartz, glass, metal film, polymethylmethacrylate (PMMA), polyimide (PI), polyethylene terephthalate (PET), polyethylene naphthalate (PEN), and polybutylene naphthalate (PBN). However, the materials of the substrate 10 are not limited thereto, as long as materials that are suitable for the substrate 10 can be used. It should be noted that the range of the thickness of the substrate 10 is greater than or equal to 5 μm and less than or equal to 100 μm. In another embodiment, the range of the thickness of the substrate 10 is greater than or equal to 5 μm and less than or equal to 40 μm. A substrate 10 with micron-level thickness may reduce the light path of the visible light converted by the scintillator layer 12 passing through the substrate 10. Therefore, the light signals detected by the detecting units 11 are prevented from becoming distorted, and thereby the detecting effect and resolution of the detecting device 1 can be enhanced.

As shown in FIGS. 1A and 1B, the scintillator layer 12 is disposed on the substrate 10, a corner area C of the scintillator layer 12 can be seen in the normal direction of the substrate 10, and the corner area C is a curved structure (as shown in FIG. 1A) or a chamfered structure (as shown in FIG. 1B). That is, two intersecting lines, which extend from two adjacent sides of the scintillator layer 12, and the corner area C form an area greater than zero. Accordingly, when the detecting device 1 collides with an object, the scintillator layer 12 are prevented from generating defects caused by the collision because there is a buffer space between the corner area C of the scintillator layer 12 and the substrate 10. Therefore, the reliability of the detecting device 1 can be increased. The materials of the scintillator layer 12 may include CsI:Tl, $Gd_2O_2S$:Tb, CsI:Na, NaI:Tl, $CaWO_4$, $ZnWO_4$, $CdWO_4$, $Bi_4Ge_3O_{12}$, $Lu_{1.8}Yb_{0.2}SiO_5$:Ce, $Gd_2SiO_5$:Ce, or another suitable material, but it is not limited thereto. In addition, the scintillator layer 12 may also be patterned as required to products. For example, the scintillator layer 12 may be designed to have a polygonal shape, a circular shape, an oval shape, or an arbitrary shape, but it is not limited thereto.

Still referring to FIGS. 1A and 1B, the detecting device 1 may further include a plurality of gate driving elements 13 and a plurality of source driving elements 14, which are configured to drive the detecting units 11 or receive the signal of the detecting units 11. In this embodiment, the gate driving elements 13 are connected to one side of the substrate 10, and the source driving elements 14 are connected to another side of the substrate 10.

Figure 2:
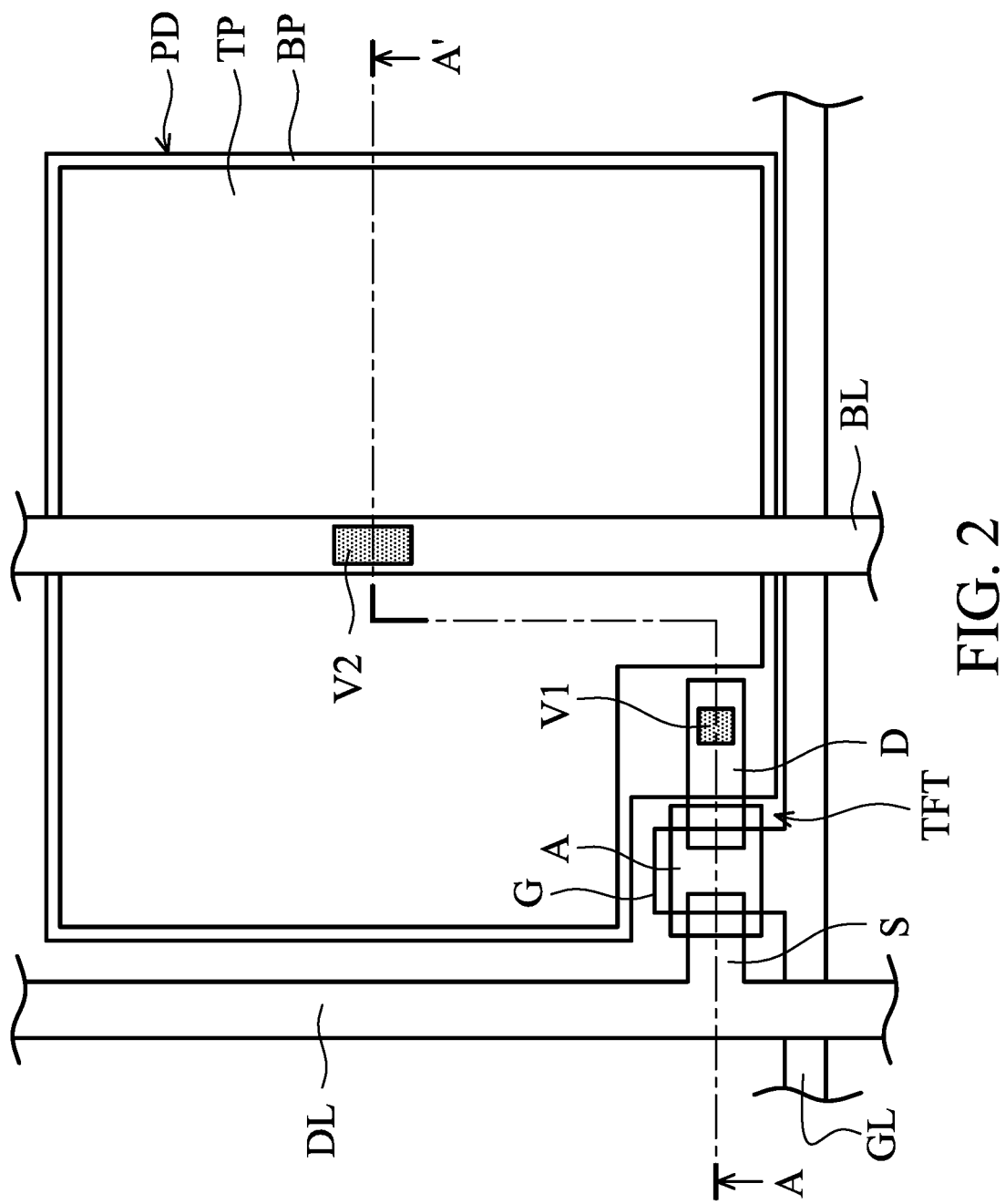
FIG. 2 is a top view of a detecting unit shown in FIG. 1A or FIG. 1B.
Figure 3:
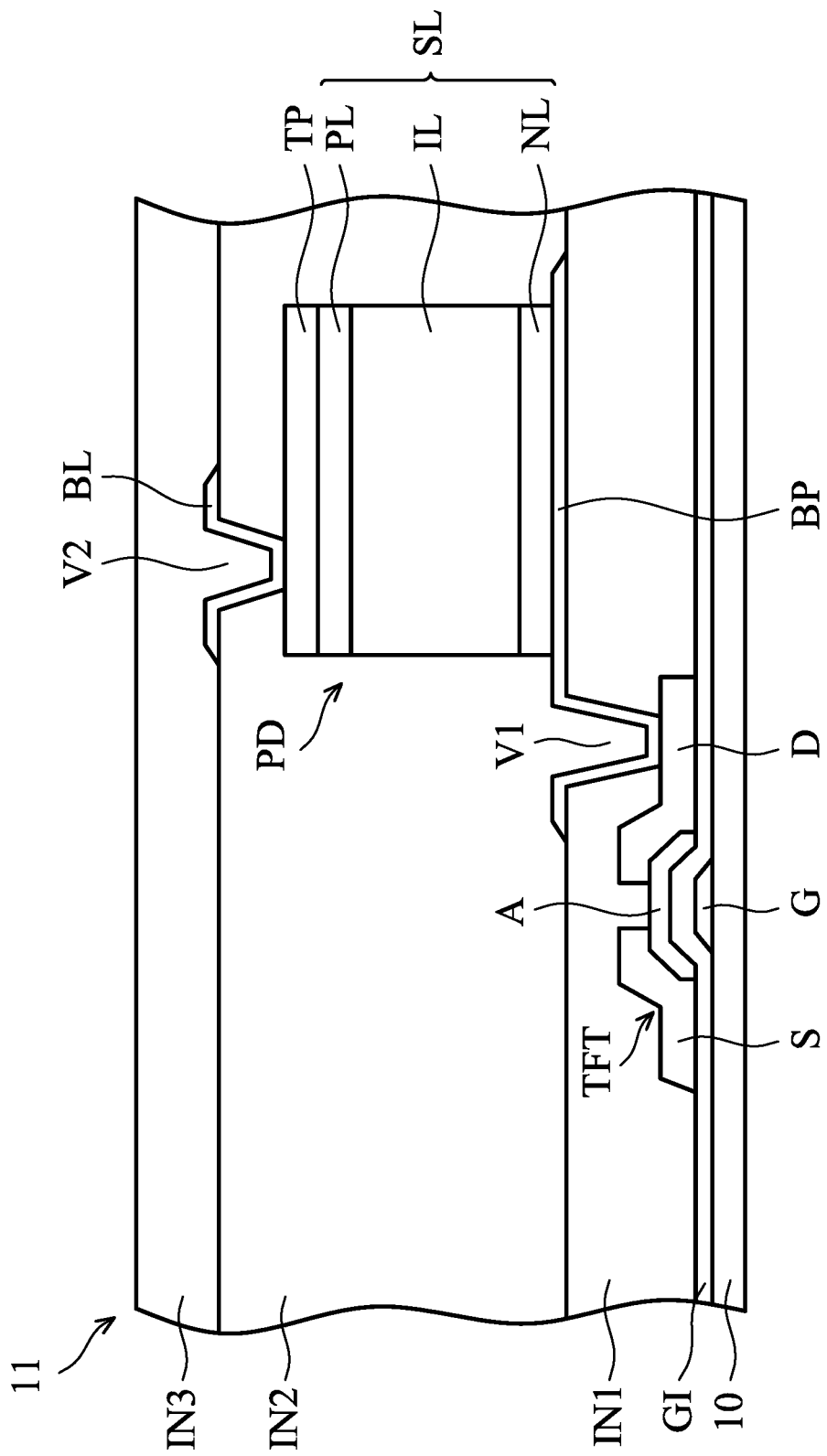
FIG. 3 is a cross-sectional view along line A-A' shown in FIG. 2.

Next, referring to FIGS. 2 and 3, FIG. 2 is a top view of the detecting unit 11 shown in FIG. 1A or FIG. 1B, and FIG. 3 is a cross-sectional view along line A-A' shown in FIG. 2. As shown in FIGS. 2 and 3, the detecting unit 11 may be defined by a gate line GL and a source line DL. The detecting unit 11 includes a transistor TFT electrically connected to the gate line GL and the source line DL. The transistor TFT is disposed on the substrate 10, and includes a gate G, a source S, a drain D, and an active layer A. A gate insulating layer GI is disposed between the gate G and the active layer A, wherein the transistor TFT may be an amorphous thin-film transistor, a low-temperature polysilicon thin-film transistor, a metal-oxide thin-film transistor, or a hybrid structure transistor, but it is not limited thereto.

Referring to FIGS. 2 and 3, the detecting unit 11 further includes a detecting element PD, which is disposed on and electrically connected to the transistor TFT. The detecting element PD includes a first electrode layer BP, and a first insulating layer IN1 with a first via hole V1 disposed between the first electrode layer BP and the drain D. The first electrode layer BP is electrically connected to the drain D through the first via hole V1. The detecting element PD includes a semiconductor layer SL and a second electrode layer TP. The semiconductor layer SL is disposed on the first electrode layer BP, and the second electrode layer TP is disposed on the semiconductor layer SL. In some embodiments, the semiconductor layer SL is disposed on the second electrode layer TP, and the first electrode layer BP is disposed on the semiconductor layer SL. The detecting unit 11 further includes a bias line BL disposed on the second electrode layer TP, and a second insulating layer IN2 with a second via hole V2 is disposed between the bias line BL and the second electrode layer TP. The bias line BL is electrically connected to the second electrode layer TP through the second via hole V2. In addition, the detecting unit 11 further includes a third insulating layer IN3 disposed on the bias line BL.

The materials of the first electrode layer BP and the second electrode layer TP may include metallic materials, such as Al, W, Mo, Ta, Cr, Ti, Cu, an alloy thereof, or a combination thereof. Examples of the materials of the first electrode layer BP and the second electrode layer TP include transparent conductive materials, such as ITO, IZO, ITSO, $In_2O_3$, $SnO_2$, ZnO, and suitable combinations thereof, but they are not limited thereto.

The semiconductor layer SL includes an N-type doped semiconductor layer NL, an intrinsic layer IL, and a P-type doped semiconductor layer PL. The N-type doped semiconductor layer NL may include an amorphous silicon layer doped with N-type impurities (such as phosphor), the intrinsic layer IL may include an undoped amorphous silicon layer, and the P-type doped semiconductor layer PL may include an amorphous silicon layer doped with P-type impurities (such as boron), but it is not limited thereto.

Figure 4:
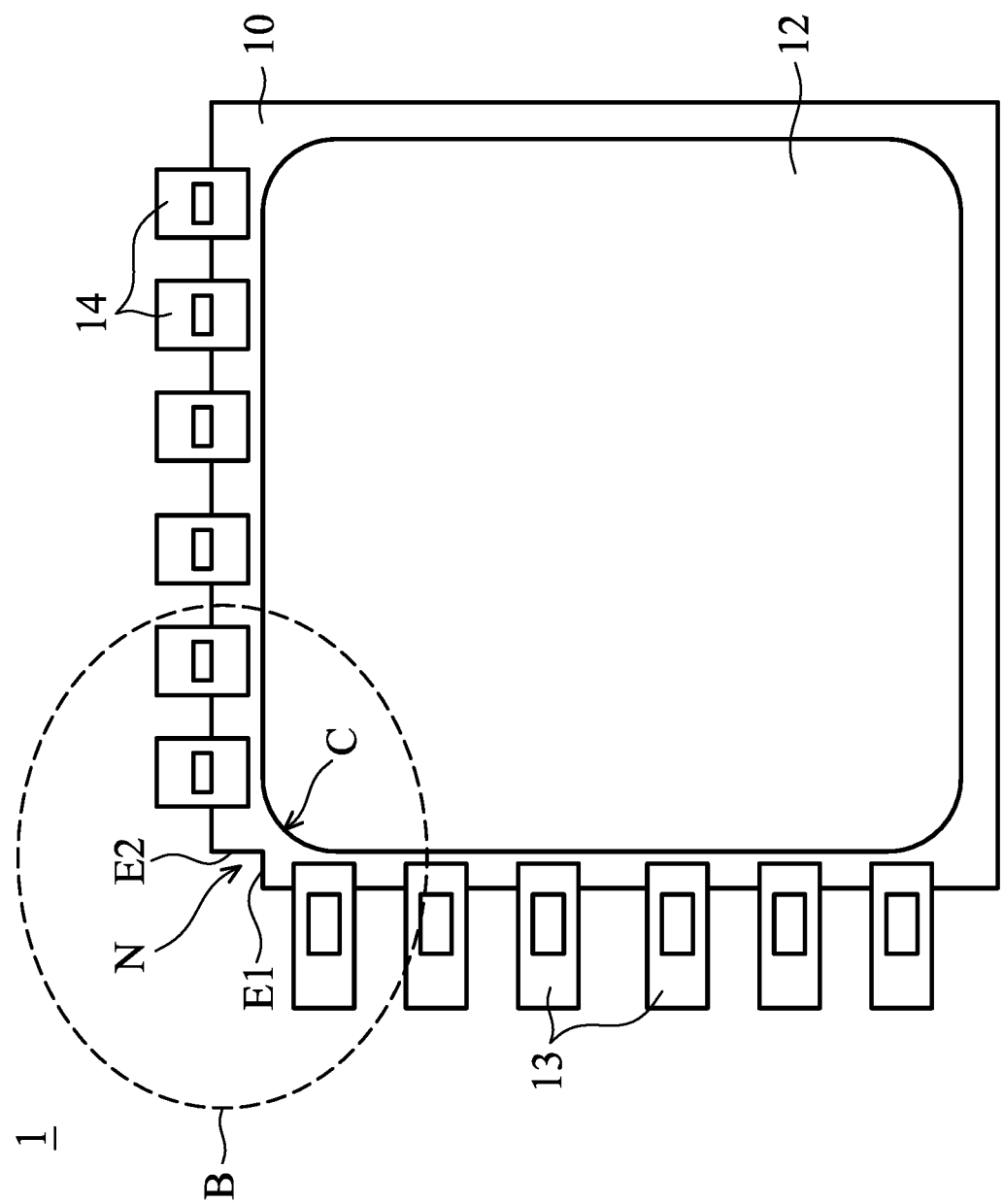
FIG. 4 is a top view of the detecting device in accordance with another embodiment of the present disclosure.
Figure 5:
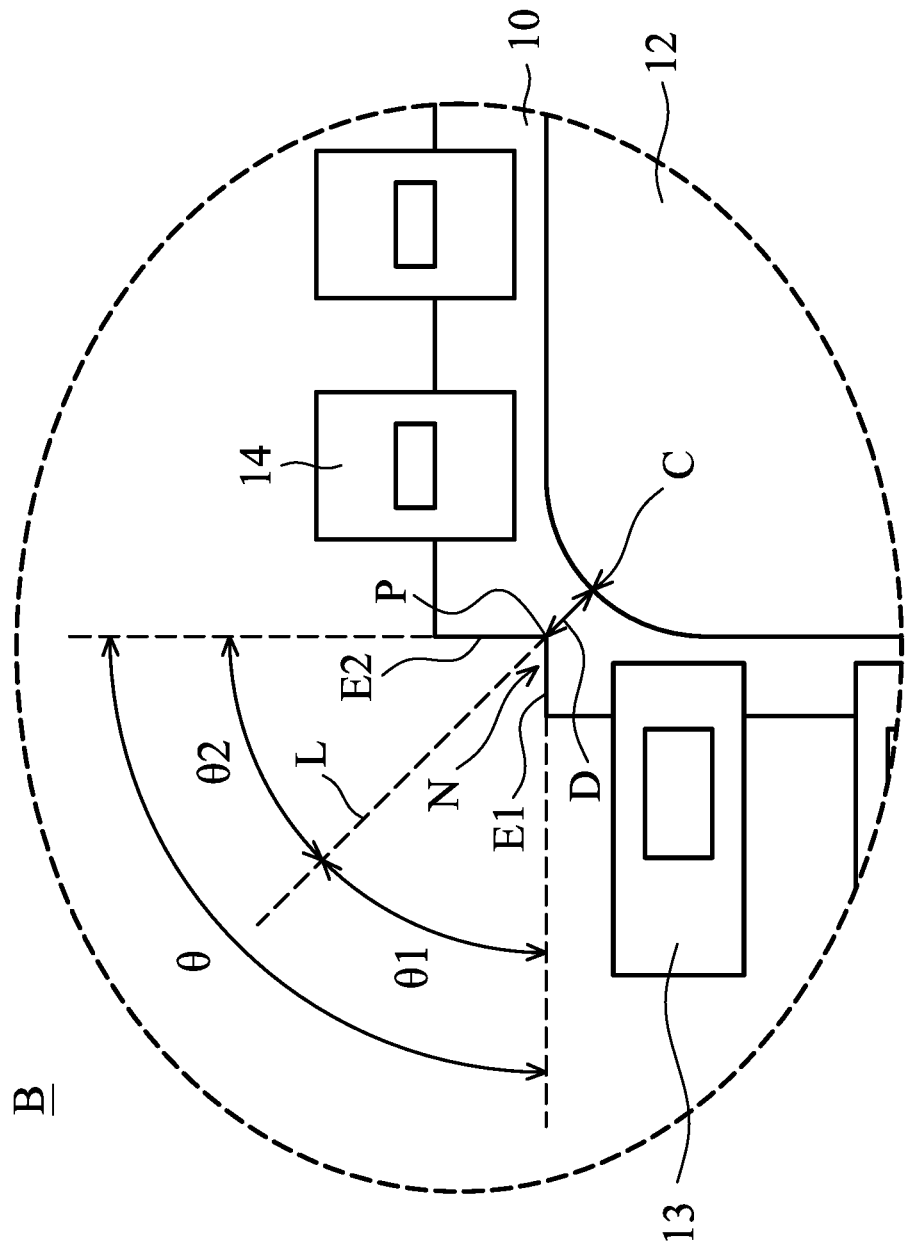
FIG. 5 is an enlarged view of the portion B shown in FIG. 4.

Next, referring to FIGS. 4 and 5, FIG. 4 is a top view of a detecting device 1 in accordance with another embodiment of the present disclosure, and FIG. 5 is an enlarged view of the portion B shown in FIG. 4. The difference between the embodiment shown in FIG. 4 and the embodiment shown in FIG. 1A is that as shown in FIG. 4, at least one turning region of the substrate 10 includes a notched structure N, and the notched structure N has a first side E1 and a second side E2. As shown in FIG. 5, the first side E1 and the second side E2 intersect at an intersection P and have an angle θ. The intersection P has a distance D to the corner area C of the scintillator layer 12 along an angle bisector L of the angle θ. The distance D is greater than 0 mm, and less than or equal to 4 mm. The distance D may also be greater than or equal to 0.5 mm, and less than or equal to 3 mm. It should be appreciated that the angle bisector L of the angle θ divides the angle θ into two equal angles θ1 and θ2. That is, the angle values of the angles θ1 and θ2 are equal to half of the angle value of the angle θ.

Figure 6:
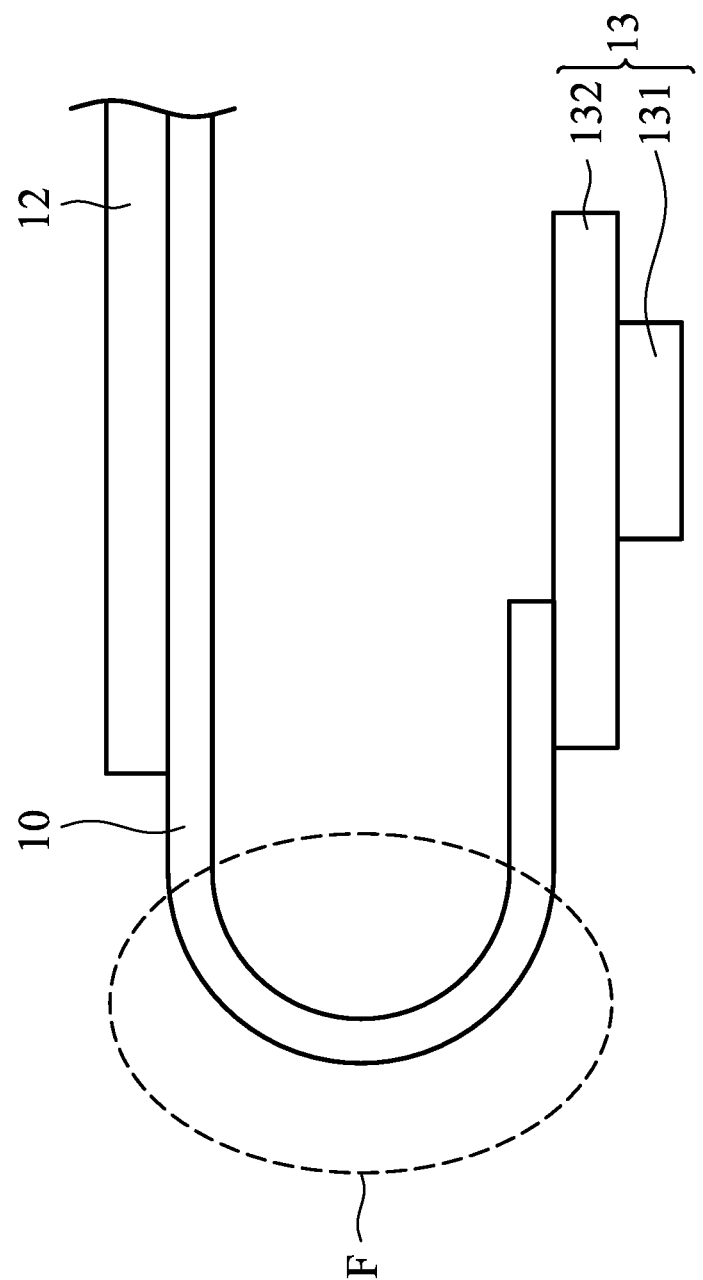
FIG. 6 is a partial schematic diagram of the detecting device shown in FIG. 5 after bending.

Referring to FIG. 6, FIG. 6 is a partial schematic diagram of the detecting device 1 shown in FIG. 5 after bending. Since the turning region of the substrate 10 includes the notched structure N, the substrate 10 may be bent such that the gate driving elements 13 are disposed below the substrate 10. Accordingly, the requirements that the detecting device 1 have a narrow frame and have greater detecting and display regions can be achieved provided the panels are the same size. In some embodiments, each of the gate driving elements 13 includes an integrated circuit (IC) 131 connected to the substrate 10. In addition, each of the gate driving elements 13 may further include a flexible circuit board 132, and the integrated circuit 131 is connected to the substrate 10 through the flexible circuit board 132. It should be appreciated that, in this embodiment, the substrate 10 has a bending section F disposed between the scintillator layer 12 and the integrated circuit 131. However, in some embodiments, the surface of the bending section F may have a protective paste configured to protect the routing on the bending section F and prevent damage due to bending. In another embodiment, the source driving elements 14 may also be disposed below the substrate 10.

Figure 7A:
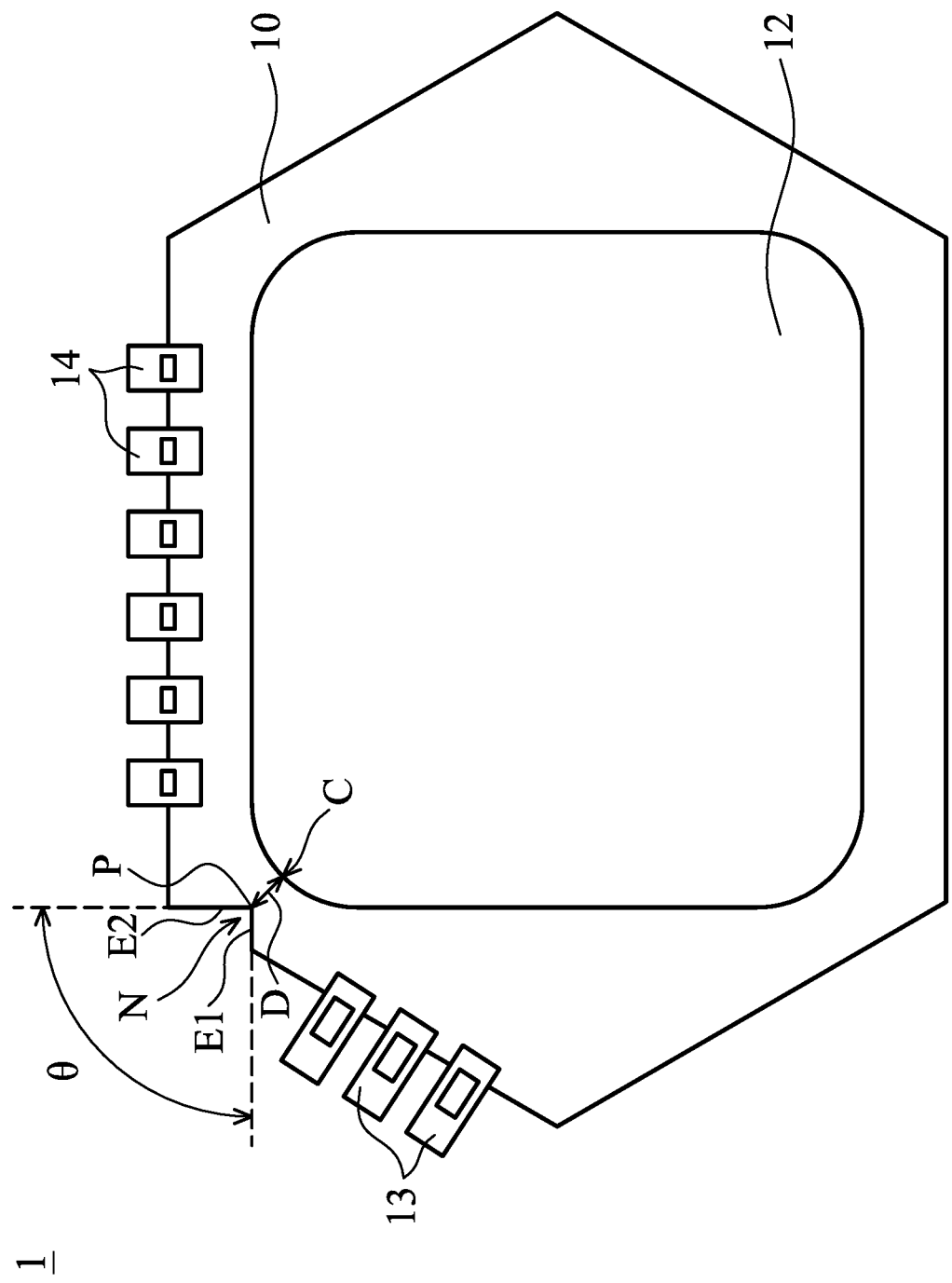
FIG. 7A is a top view of the detecting device in accordance with another embodiment of the present disclosure.
Figure 7B:
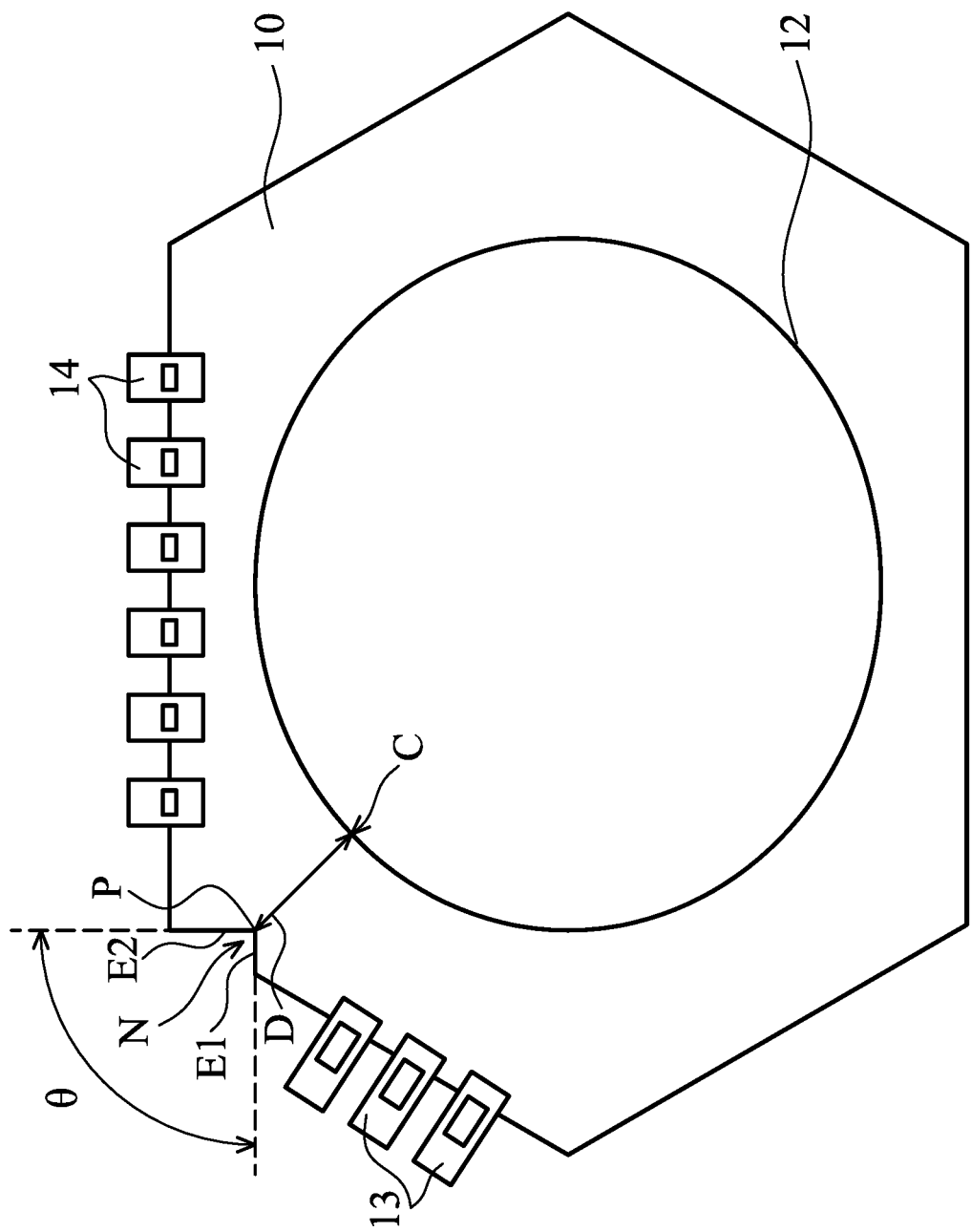
FIG. 7B is a top view of the detecting device in accordance with another embodiment of the present disclosure.

FIGS. 7A and 7B are top views of a detecting device 1 in accordance with another embodiment of the present disclosure. The difference between FIGS. 7A-7B and FIG. 4 is that the shape of the substrate 10 in FIG. 7A is not rectangular or square. In addition to the shape of the substrate 10 in FIG. 7B not being a rectangle or a square, the shape of the scintillator layer 12 is substantially circular or oval, instead of being a rectangle or a square. However, the turning region of the substrate 10 shown in FIGS. 7A and 7B may also include a notched structure N, and the notched structure N also has a first side E1 and a second side E2. In some embodiments, the first side E1 and the second side E2 intersect at an intersection P and have an angle θ. The intersection P has a distance D to the scintillator layer 12 along an angle bisector of the angle θ. The distance D is greater than 0 mm, and less than or equal to 4 mm. The distance D may also be greater than or equal to 0.5 mm, and less than or equal to 3 mm.

Figure 8A:
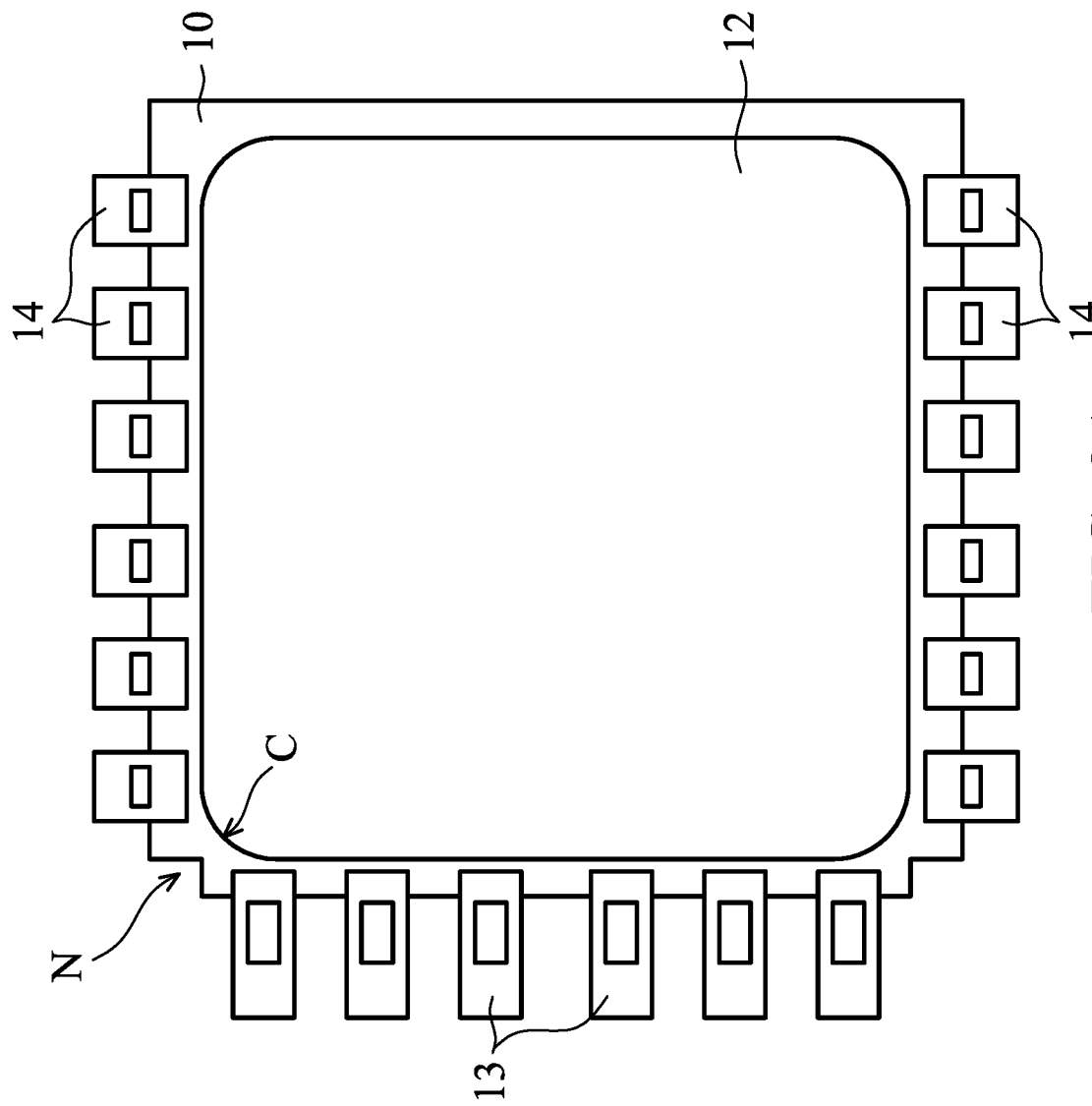
FIG. 8A is a top view of the detecting device in accordance with another embodiment of the present disclosure.
Figure 8B:
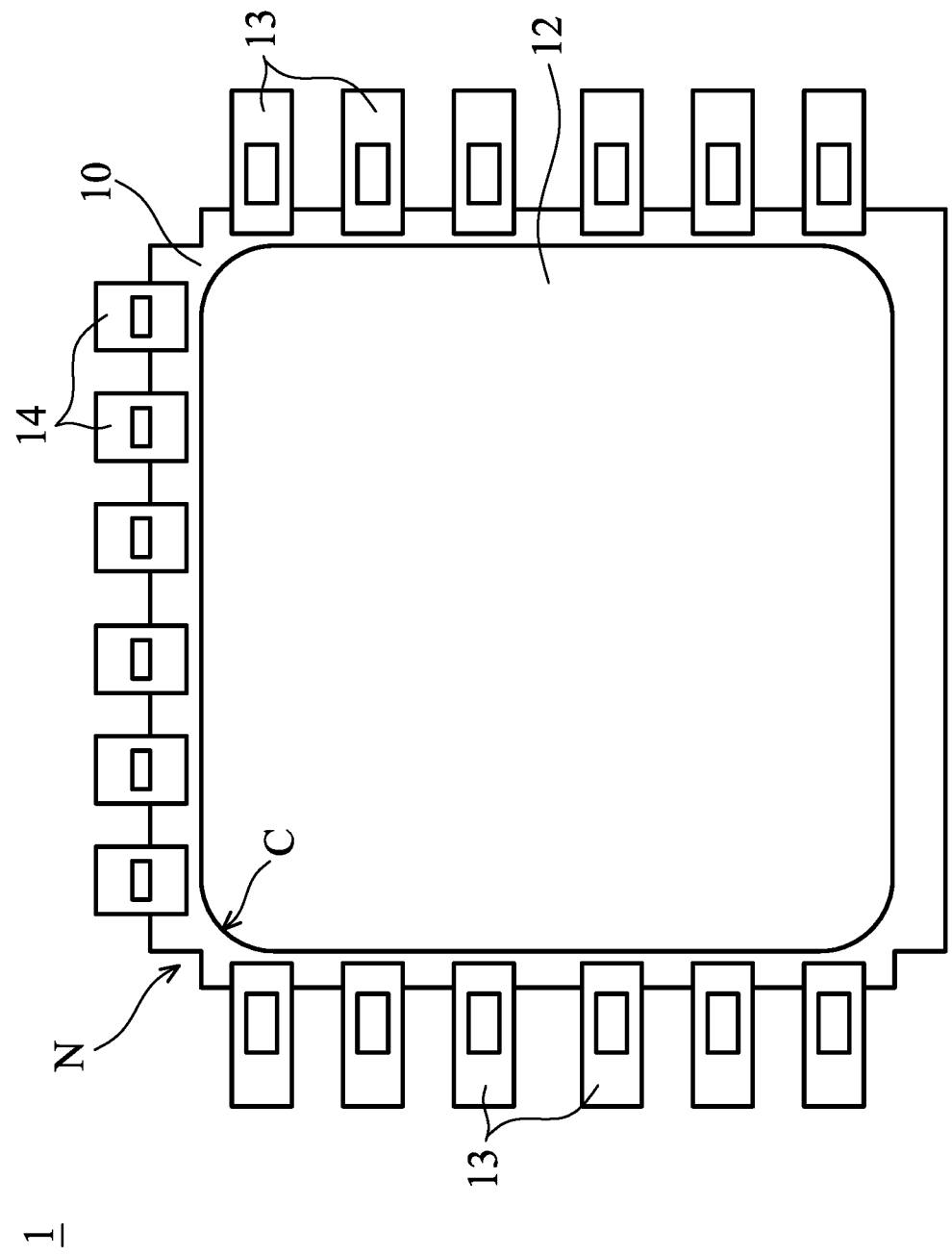
FIG. 8B is a top view of the detecting device in accordance with another embodiment of the present disclosure.
Figure 8C:
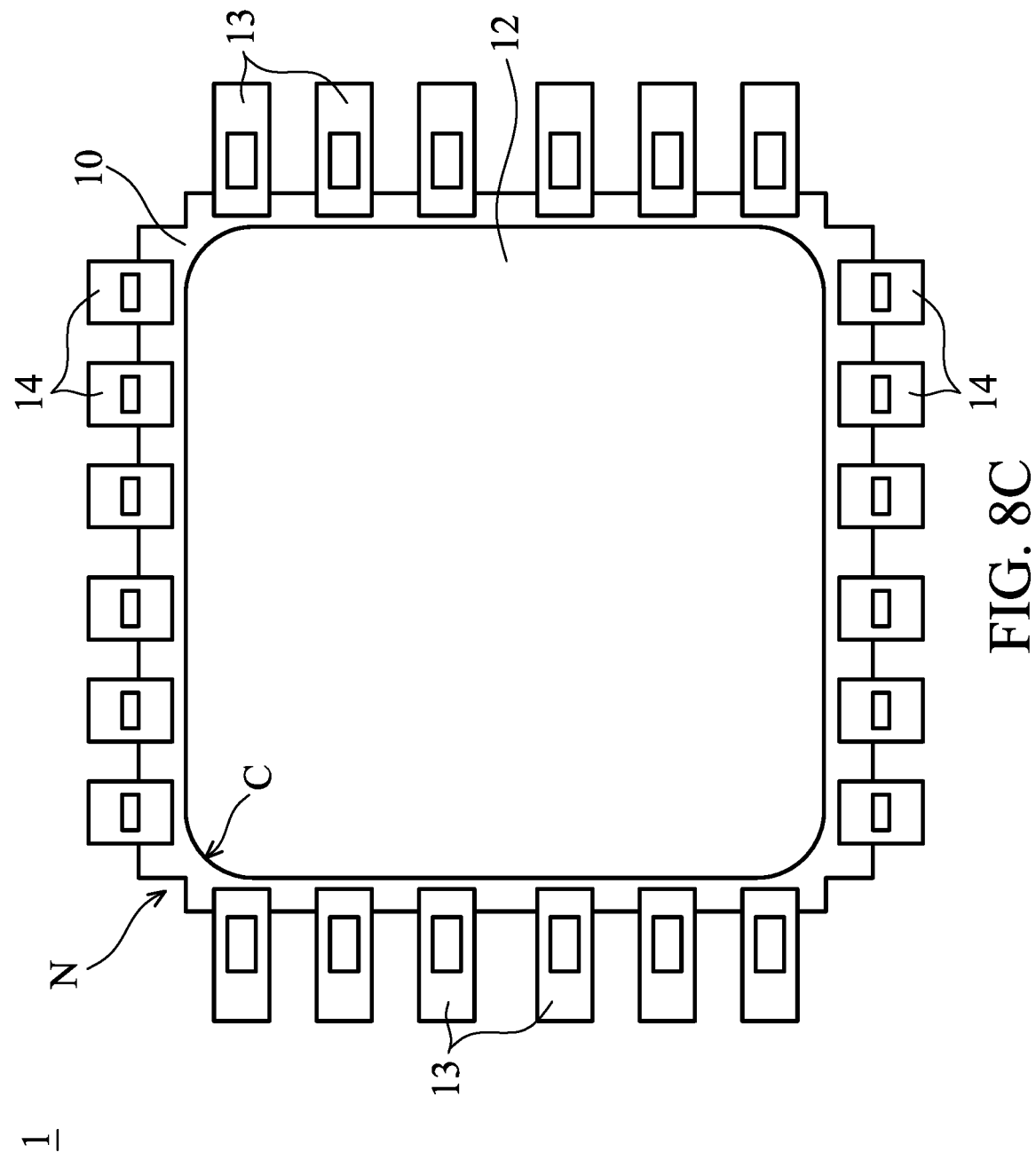
FIG. 8C is a top view of the detecting device in accordance with another embodiment of the present disclosure.

Next, referring to FIGS. 8A-8C, FIGS. 8A-8C are top views of the detecting device 1 in accordance with another embodiment of the present disclosure. The difference between FIGS. 8A-8C and FIG. 4 is that the source driving elements 14 shown in FIG. 8A are connected to two opposite sides of the substrate 10. The gate driving elements 13 shown in FIG. 8B are connected to the other opposite sides of the substrate 10. The source driving elements 14 shown in FIG. 8C are connected to two opposite sides of the substrate 10, and the gate driving elements 13 are connected to the other opposite sides of the substrate 10. In addition, as required to products, a plurality of turning regions of the substrate 10 may correspondingly include a plurality of notched structures N, respectively.

Figure 9A:
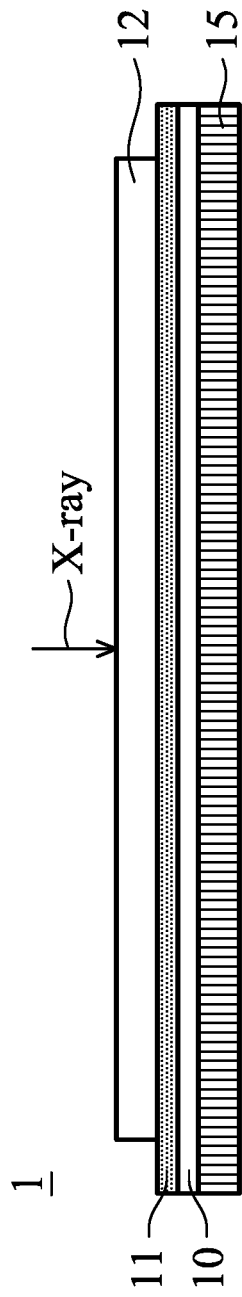
FIG. 9A is a cross-sectional view of the detecting device in accordance with an embodiment of the present disclosure.
Figure 9B:
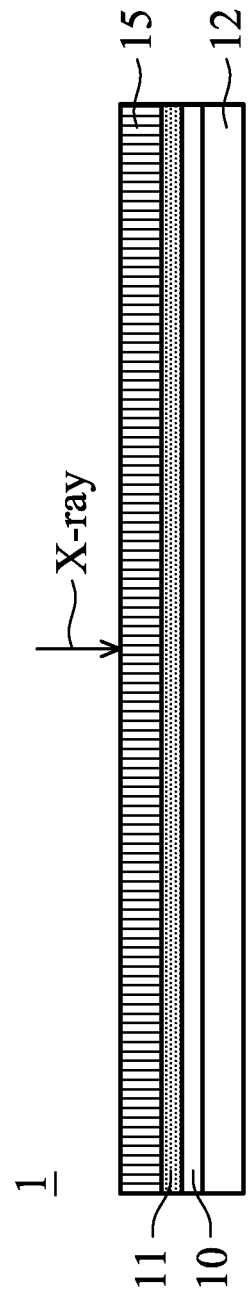
FIG. 9B is a cross-sectional view of the detecting device in accordance with another embodiment of the present disclosure.
Figure 9C:
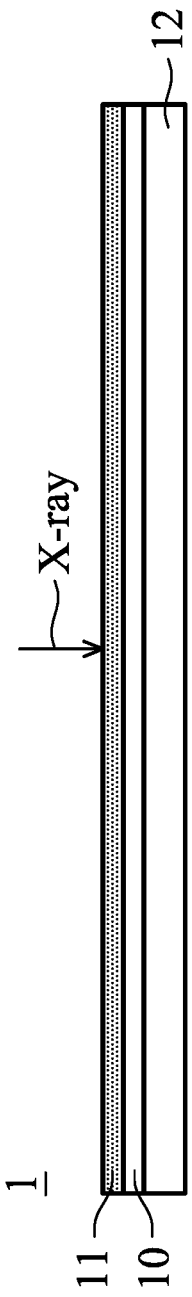
FIG. 9C is a cross-sectional view of the detecting device in accordance with another embodiment of the present disclosure.

FIGS. 9A-9C are cross-sectional views of the detecting device 1 in accordance with different embodiments of the present disclosure. For clarity of illustration, the substrate 10 and the detecting unit 11 are combined and shown together.

First, as shown in FIG. 9A, the detecting device 1 further includes a reflective layer 15. The reflectivity of the reflective layer 15 is greater than or equal to 50%. The substrate 10 is disposed between the reflective layer 15 and the scintillator layer 12. The reflective layer 15 is formed below the substrate 10, and the scintillator layer 12 is formed over the detecting unit 11 (i.e. over the second electrode layer TP). That is, the scintillator layer 12 and the detecting unit 11 are formed on the same side of the substrate 10, and the reflective layer 15 and the detecting unit 11 are formed on opposite sides of the substrate 10. It should be noted that, in this embodiment, the first electrode layer BP or the second electrode layer TP may be transparent electrode layers formed by transparent conductive materials. Accordingly, after incident X-ray from the top is converted to visible light by the scintillator layer 12, the visible light is detected by the detecting element PD. Also, the visible light, which is not detected by the detecting element PD, is reflected and reused through arranging the reflective layer 15 below the substrate 10. In some embodiments, the area of the reflective layer 15 is greater than or equal to that of the scintillator layer 12, and smaller than or equal to that of the substrate 10. In addition, the reflective layer 15 may also have the function of supporting the substrate 10. Since the thickness of the substrate 10 is thinner, combining the reflective layer 15 and the substrate 10 may enhance the overall strength and rigidity as required.

Second, as shown in FIG. 9B, the detecting device 1 further includes a reflective layer 15. The reflectivity of the reflective layer 15 is greater than or equal to 50%. The substrate 10 is disposed between the reflective layer 15 and the scintillator layer 12. The difference between FIG. 9B and FIG. 9A is that the scintillator layer 12 is formed below the substrate 10, and the reflective layer 15 is formed over the detecting unit 11 (i.e. over the second electrode layer TP). That is, the scintillator layer 12 and the detecting unit 11 are formed on opposite sides of the substrate 10, and the reflective layer 15 and the detecting unit 11 are formed on the same side of the substrate 10. It should be noted that, in this embodiment, the first electrode layer BP or the second electrode layer TP may be transparent electrode layers formed by transparent conductive materials. Accordingly, after an incident X-ray from the top is converted to visible light by the scintillator layer 12, the visible light is detected by the detecting element PD. Also, the visible light, which is not detected by the detecting element PD, is reflected and reused by arranging the reflective layer 15 over the substrate 10. In some embodiments, the area of the reflective layer 15 is greater than or equal to that of the scintillator layer 12, and smaller than or equal to that of the substrate 10. In addition, the reflective layer 15 may also have the function of supporting the substrate 10. It should be appreciated that, in this embodiment, when the X-ray just enters the scintillator layer 12, the converted visible light may be immediately detected by the detecting element PD. Blurry images caused by light intensity decay or light diffusion would be less generated such that better resolution can be achieved.

Finally, as shown in FIG. 9C, the scintillator layer 12 is formed below the substrate 10. That is, the scintillator layer 12 and the detecting unit 11 are formed on opposite sides of the substrate 10, and no reflective layer 15 is disposed. It should be noted that, in this embodiment, the first electrode layer BP is a transparent electrode layer formed by transparent conductive materials, and the second electrode layer TP is a metal electrode layer formed by metallic materials. Accordingly, the second electrode layer TP blocks external light, preventing it from entering the detecting element PD and interfering with the detection process. It should be appreciated that, in this embodiment, when the X-ray just enters the scintillator layer 12, the converted visible light may be immediately detected by the detecting element PD. Blurry images caused by light intensity decay or light diffusion would be generated less often, meaning that better overall resolution can be achieved.

As set forth above, the embodiments of the present disclosure provide a detecting device 1, wherein at least one corner area of the scintillator layer 12 of the detecting device 1 has a curved structure or a chamfered structure, and thereby the detecting effect and display quality of the detecting device can be improved.

It should be noted that the aforementioned sizes, parameters and shapes of the elements are not limitations of the present disclosure. Those skilled in the art may adjust these settings according to different needs. Moreover, the organic light-emitting diode displays and the methods for manufacturing the same of the present disclosure are not limited to the configurations shown in FIGS. 1A-9C. Some embodiments of the present disclosure may include any one or more features of any one or more embodiments of FIGS. 1A-9C. That is to say, not every feature of all the drawings should be performed at the same time in the organic light-emitting diode displays and the methods for manufacturing the same of the embodiments of the present disclosure.

While the present disclosure has been described by way of example and in terms of some embodiments, it is to be understood that those skilled in the art may make various changes, substitutions, and alterations to the present disclosure without departing from the spirit and scope of the present disclosure. For example, different features in different embodiments can mix together to form another embodiment of the present disclosure. In addition, the scope of the present disclosure is not limited to the processes, machines, manufacture, composition, devices, methods and steps in the specific embodiments described in the specification. From some embodiments of the present disclosure, those skilled in the art may understand existing or developing processes, machines, manufacture, compositions, devices, methods and steps, which may be performed in the aforementioned embodiments or obtained substantially the same result, may be used in accordance with some embodiments of the present disclosure. Therefore, the scope of the present disclosure includes the aforementioned processes, machines, manufacture, composition, devices, methods, and steps. Furthermore, each of the appended claims constructs an individual embodiment, and the scope of the present disclosure also includes every combination of the appended claims and embodiments.

What is claimed is:

1. A detecting device, comprising:
   a substrate;
   at least one transistor disposed on the substrate;
   at least one detecting element disposed on and electrically connected to the transistor, wherein the detecting element comprises:
   a first electrode layer;
   a semiconductor layer disposed on the first electrode layer;
   a second electrode layer disposed on the semiconductor layer;
   a scintillator layer disposed on a side of the substrate, wherein from a top view perspective, at least one corner area of the scintillator layer comprises a curved structure or a chamfered structure, and
   a reflective layer, and the substrate is disposed between the reflective layer and the scintillator layer, wherein the area of the reflective layer is greater than or equal to the area of the scintillator layer, and smaller than or equal to the area of the substrate.

2. The detecting device as claimed in claim 1, wherein at least one turning region of the substrate comprises a notched structure.

3. The detecting device as claimed in claim 2, wherein the notched structure further comprises a first side and a second side, the first side and the second side intersect at an intersection and have an angle, wherein there is a distance between the intersection and the scintillator layer along an extending direction of an angle bisector of the angle, and the distance is greater than 0 mm and less than or equal to 4 mm.

4. The detecting device as claimed in claim 1, wherein the substrate has a thickness, and the thickness is in a range of 5 μm to 100 μm.

5. The detecting device as claimed in claim 1, wherein the reflectivity of the reflective layer is greater than or equal to 50%.

6. The detecting device as claimed in claim 1, wherein the first electrode layer is a transparent electrode layer.

7. The detecting device as claimed in claim 6, wherein the scintillator layer and the detecting element are disposed on the same side of the substrate.

8. The detecting device as claimed in claim 6, wherein the scintillator layer and the detecting element are disposed on opposite sides of the substrate.

9. The detecting device as claimed in claim 1, wherein the scintillator layer and the detecting element are disposed on opposite sides of the substrate, and the second electrode layer is a metal electrode layer.

10. The detecting device as claimed in claim 1, further comprising:
   a plurality of gate driving elements disposed on one side of the substrate; and
   a plurality of source driving elements disposed on another side of the substrate.

11. The detecting device as claimed in claim 10, wherein the plurality of gate driving elements and the plurality of source driving elements are disposed on adjacent sides of the substrate.

12. The detecting device as claimed in claim 10, wherein each of the plurality of gate driving elements further comprises an integrated circuit and a flexible circuit board, the flexible circuit board is in contact with the substrate, and the integrated circuit is connected to the substrate through the flexible circuit board.

13. The detecting device as claimed in claim 12, wherein the substrate has a bending section disposed between the scintillator layer and the integrated circuit.

14. The detecting device as claimed in claim 13, wherein a protective paste is disposed on the bending section.

15. The detecting device as claimed in claim 1, wherein the semiconductor layer further comprises an N-type doped semiconductor layer, an intrinsic layer, and a P-type doped semiconductor layer, and the intrinsic layer is disposed between the N-type doped semiconductor layer and the P-type doped semiconductor layer.

16. The detecting device as claimed in claim 1, further comprising a bias line disposed on the second electrode layer.

17. The detecting device as claimed in claim 1, further comprising a first insulating layer disposed on the substrate, and a second insulating layer disposed on the first insulating layer, wherein the first insulating layer has a first via hole, and the second insulating layer has a second via hole.

18. The detecting device as claimed in claim 17, wherein the second via hole is directly above the detecting element.

* * * * *